United States Patent
Gan et al.

(10) Patent No.: US 7,106,130 B2
(45) Date of Patent: Sep. 12, 2006

(54) VARIABLE FREQUENCY PWM CONTROLLER CIRCUIT

(75) Inventors: Hongjian Gan, Taipei (TW); Bo Wang, Taipei (TW); Alpha J. Zhang, Taipei (TW)

(73) Assignee: Delta Electronics, Inc., Taipei (TW)

( * ) Notice: Subject to any disclaimer, the term of this patent is extended or adjusted under 35 U.S.C. 154(b) by 111 days.

(21) Appl. No.: 10/656,420

(22) Filed: Sep. 5, 2003

(65) Prior Publication Data

US 2005/0052249 A1   Mar. 10, 2005

(51) Int. Cl.
*H03F 3/38* (2006.01)
(52) U.S. Cl. .......... 330/10; 330/295; 331/74; 331/143; 323/268; 323/288; 363/89
(58) Field of Classification Search .......... 331/74, 331/143, 111; 363/21.18, 26, 41, 89; 327/306, 327/131, 132; 323/268, 272, 282, 288, 207; 330/10, 295
See application file for complete search history.

(56) References Cited

U.S. PATENT DOCUMENTS

| | | | |
|---|---|---|---|
| 3,944,949 A * | 3/1976 | Herzog | 332/112 |
| 6,107,894 A * | 8/2000 | Van Tuijl et al. | 331/143 |
| 6,225,872 B1 * | 5/2001 | Verhoeven | 331/143 |
| 6,608,521 B1 * | 8/2003 | Baldwin et al. | 330/10 |
| 6,728,121 B1 * | 4/2004 | Ben-Yaakov et al. | 363/89 |
| 2005/0077971 A1 * | 4/2005 | Bashar | 331/36 C |

* cited by examiner

Primary Examiner—Michael B Shingleton
(74) Attorney, Agent, or Firm—Volpe and Koenig, P.C.

(57) ABSTRACT

The present invention discloses a circuit that generates a variable frequency pulse width modulation (VF PWM) signal. Different from the conventional PWM controller, the frequency and duty cycle of the output PWM signal vary with the error-amplified voltage of the feedback loop simultaneously in this invention. The higher the error-amplified voltage of the feedback loop is, the lower the duty cycle with lower frequency will be. A very low duty cycle PWM signal can be generated stably while its frequency is very low.

11 Claims, 4 Drawing Sheets

VARIABLE FREQUENCY PWM
CONTROLLER CIRCUIT

FIELD OF THE INVENTION

The present invention relates to switching mode power supplies, and more specifically to a varied frequency pulse width modulation controller for low standby loss solution.

BACKGROUND OF THE INVENTION

The trend in the design of switching mode power supplies has been toward relatively low power loss, low ripple and low noise under light load condition, especially for those widely used adaptors for notebooks, computers, and chargers for mobile telecommunication apparatus. This kind of power supplies frequently operates under a light or zero load condition, which is named as the standby operation mode.

A flyback converter is the most commonly used topology for this application with pulse width modulation (PWM) control for the output regulation. To achieve relatively very low power loss under light or open load condition, it is the key factor to control the power stage to operate at a relatively very low switching frequency to decrease the switching loss and driving loss of the generally used MOSFET power switch. Meanwhile, the control circuit dissipates relatively low loss due to relatively low frequency operation.

The conventional PWM controller circuit according to the general prior art always operates at a constant frequency, corresponding to the switching period T as shown in FIG. 1, which shows the operating PWM signal for the normal and standby operation mode respectively. The power circuit operates with relatively a long on time PWM, Ton,nor, and thus a high duty cycle under normal load condition. In the standby operation mode, the power circuit always operates with relatively a very short time Ton,sb and thus a very small duty cycle, but the switching frequency is still high as normal operation, resulting in relatively much switching loss and driving loss of the main switch and much power loss of the controller which are the major parts of the standby loss. Therefore, the standby loss of the converter will be relatively high. However the advantage of the PWM controller circuit is that the output ripple and noise are relatively very low even at the standby operation mode.

Moreover, there are generally two methods to decrease the switching related loss which is the main component of the standby loss. One is to decrease the switching frequency by regulating the Toff time of the PWM signal while keeping a constant Ton time of the PWM signal for standby operation. Please refer to FIG. 2. In the standby operation mode, the constant switching on time of PWM signal is Ton,sb, which is equal to the counterpart Ton,nor for the normal operation mode. But the Toff time is regulated as Toff,sb, which is relatively much longer than that Toff,nor for the normal operation mode. As a result, the switching period is relatively much longer than that of the normal operation mode and the switching frequency is relatively much lower which benefits to the relatively low standby loss in the standby operation mode as mentioned before.

One drawback of this control method is that the conversion power at each switching cycle will be relatively high due to the constant on time of the PWM signal in the standby operation mode. Therefore, relatively high output voltage noise and even audible noise might be introduced to the converter though the standby loss can be effectively reduced.

The other method is a burst mode control for the standby operation mode. Please refer to FIG. 3 for the operation PWM signal with this control mode. In the normal operation mode, the PWM signal is relatively with a high frequency and long on time as Ton,nor. In the standby operation mode, the on time of PWM signal can be regulated relatively short as Ton,sb at each switching period, but after several continuous switching periods, some switching periods will be skipped. Therefore, in the standby operation mode, the equivalent switching period will be Tsb/n, where n is the numbers of PWM pulses during the Tsb time. It can be seen that, in the standby operation mode, the equivalent switching period of the PWM signal is longer than that of the normal operation mode. So, the switching related loss can be effectively reduced and thus the relatively low standby loss can be achieved.

But there are problems with this control mode also. In the standby operation mode, the conversion power of the converter during the several continuous switching periods with PWM pulses will be relatively high, resulting in relatively high output voltage noise. Meanwhile, the several continuous switching periods with PWM pulses occur during a relatively long Tsb period corresponding to a relatively low frequency. This will also introduces the audible noise to the converter.

It is therefore attempted by the applicant to deal with the above situation encountered with the prior art.

SUMMARY OF THE INVENTION

A new PWM signal generating scheme is presented, as shown in FIG. 4. The on time and the off time of the PWM signal are regulated simultaneously according to the scheme. Each of the generated PWM signals will have relatively a very short on time and a very low frequency in the standby operation mode, and have relatively a high frequency and a long on time in the normal operation mode, thus the aforementioned ripple and noise can be eliminated while the relatively low standby loss feature is maintained.

In more details, each of the PWM signals will have relatively a long on time Ton,nor and a short switching period Tnor in the normal operation mode according to the present invention. Thus, the duty cycle Dnor, which is equal to Ton,nor/Tnor, is relatively high and the switching frequency fnor, which is equal to 1/Tnor, is relatively high too. These relatively high duty cycle and high switching frequency are advantageous to the relatively high power density and high efficiency design of the power converter.

As the load decreasing, the on time of the PWM signal is decreased while the off time of the PWM signal is increased. As a result, the on time Ton,sb of the PWM signal is reduced to a relatively low value, the off time Toff,sb and thus the switching period Tsb are increased to a relatively high value in the standby operation mode. Therefore, relatively very low duty cycle and very low switching frequency can be achieved in the standby operation mode of the power converter, wherein relatively low standby loss, low output voltage noise and no audible noise are realized simultaneously.

In accordance with the preferred embodiment of the present invention, a circuit generating a wide range of variable frequency (VF) PWM control signals is provided. An error-amplified voltage $V_{E/A}$ is generated by a feedback loop. And then this $V_{E/A}$ is input into a ramp generator. The ramp generator is composed of a controllable charge current source, a controllable discharge current source, and a timing capacitor. These two current sources charge and discharge the timing capacitor, which generates a ramp signal. Typically, a PWM comparator, and a hysteretic voltage comparator will be employed to process this ramp signal and generate a PWM signal.

The controllable charge current source and controllable discharge current source are controlled by the value of the error-amplified voltage $V_{E/A}$. Corresponding to the load decreasing condition, the lower the error-amplified voltage $V_{E/A}$ is, the higher the charge current and the lower the discharge current will be. Relatively, the rising time of the ramp signal will be shorter, and the descending time will be longer. Therefore, the generated PWM signal features relatively a lower duty cycle and a lower frequency.

The present invention allows relatively a low duty cycle and a low frequency operation, which makes a power converter operate with relatively low ripple, low noise and low standby loss. This is a significant improvement over the prior art.

The present invention may best be understood through the following description with reference to the accompanying drawings, in which:

DETAILED DESCRIPTION OF THE PREFERRED EMBODIMENT

Although this invention is susceptible to embodiments of many different forms, a preferred embodiment will be described and illustrated in detail herein. The present disclosure exemplifies the principle of the invention and is not being considered a limitation to the broader aspects of the invention to the particular embodiment as described.

Figure 1:
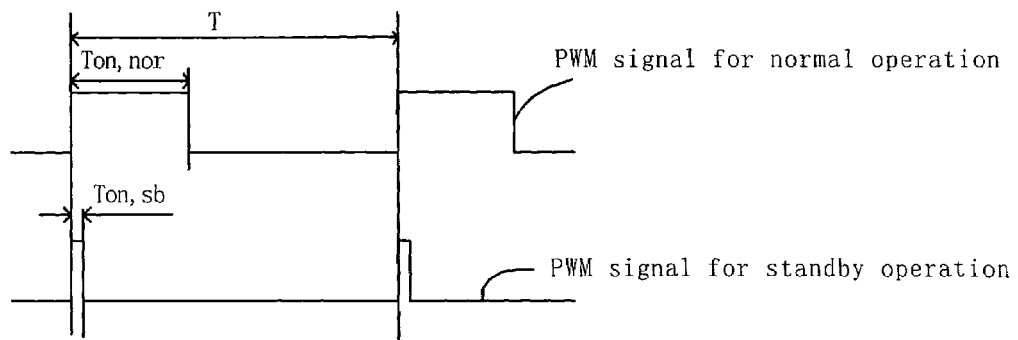
FIG. 1 shows a PWM signal generating scheme of a conventional PWM controller.
Figure 2:
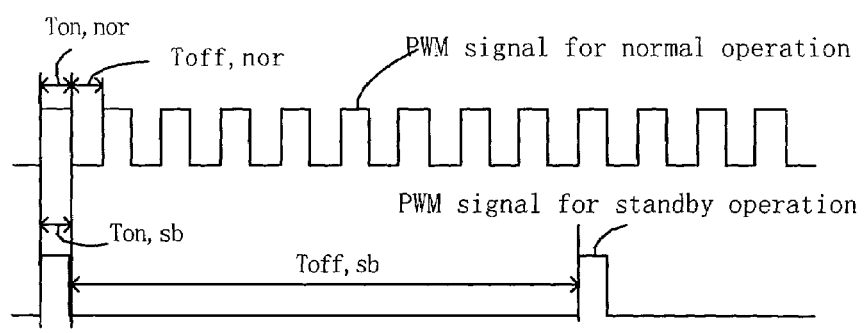
FIG. 2 shows a frequency decreasing PWM signal generating scheme for low standby loss.
Figure 3:
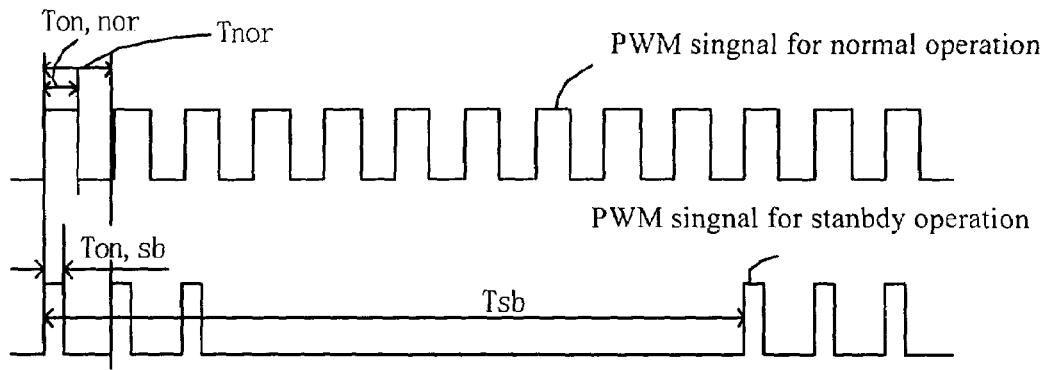
FIG. 3 shows a burst mode PWM signal generating scheme for low standby loss.
Figure 4:
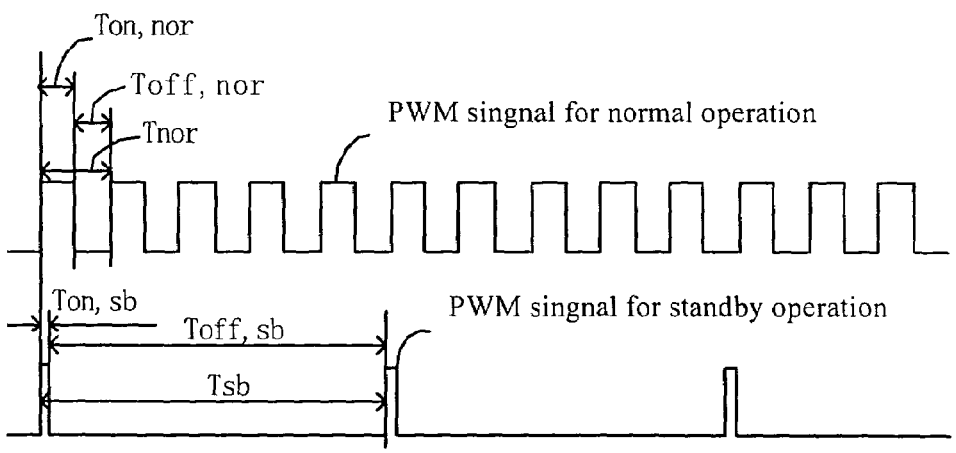
FIG. 4 shows a PWM signal generating scheme for low standby loss according to the present invention.
Figure 5:
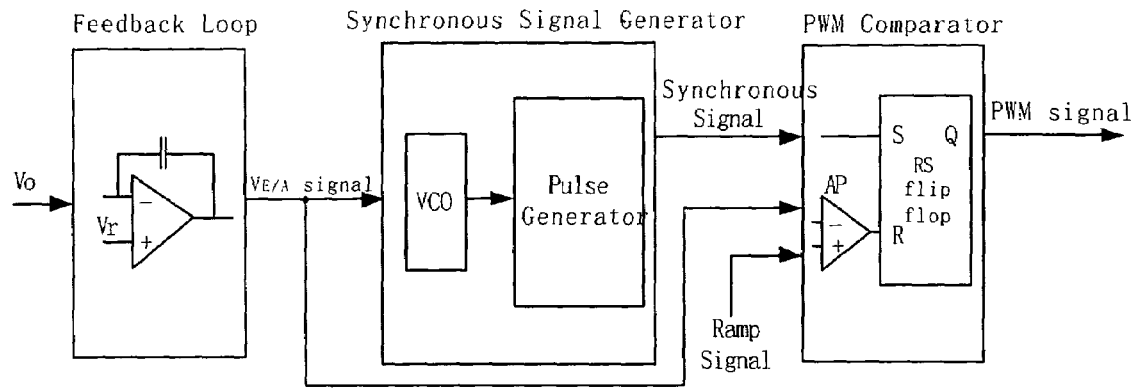
FIG. 5 shows a preferred embodiment of the controller circuit according to the present invention.

In FIG. 5, a circuit diagram to realize the VF PWM control scheme according to the present invention is shown. The overall circuit of the invention has three parts including a feedback loop, a synchronous signal generator and a PWM comparator.

The output voltage is input to the feedback loop which in-turn outputs an error-amplified voltage $V_{E/A}$. The $V_{E/A}$ signal is firstly input to a synchronous signal generator, which includes a VCO (Voltage Control Oscillator) and selectively includes a pulse generator, which is an optional component coupled to the VCO and can be omitted without damping the functions of the synchronous generator, and outputs a variable frequency synchronous signal according to the value of the $V_{E/A}$ signal. The PWM comparator, including a comparator AP and a RS flip flop, with the synchronous signal, the $V_{E/A}$ signal and a ramp signal as inputs and generates a PWM signal.

Figure 6A:
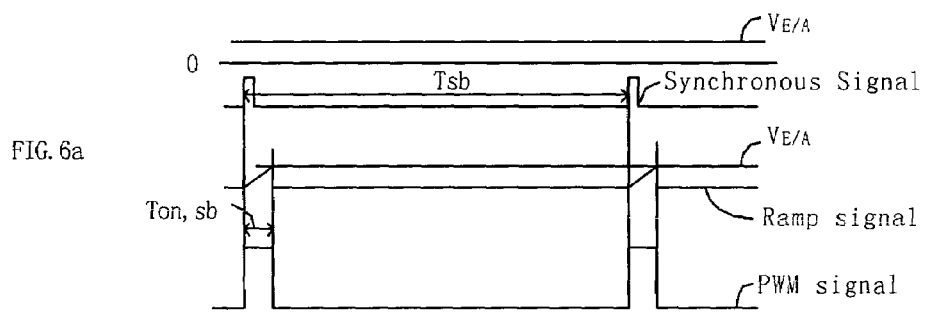
FIG. 6 shows the operation waveforms of the controller circuit according to the first preferred embodiment of the present invention.
Figure 6B:
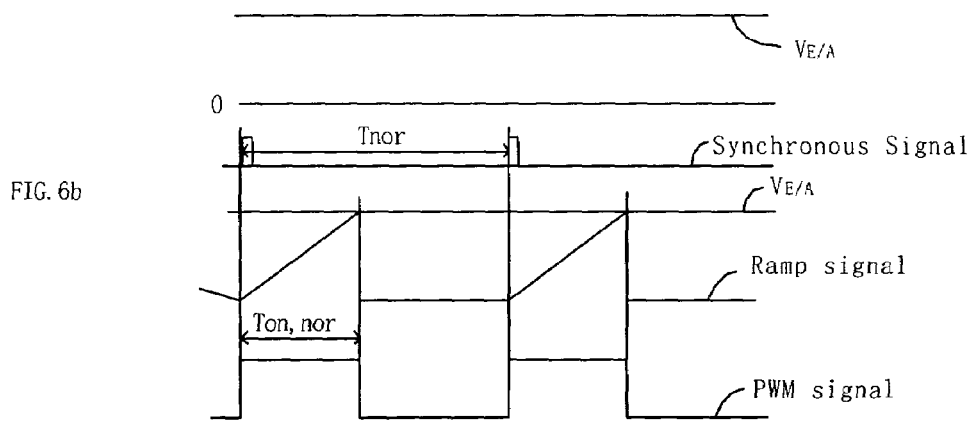

The operation waveforms can be illustrated in FIG. 6a and FIG. 6b, wherein FIG. 6a shows the standby operation mode and FIG. 6b shows the normal operation mode. In the standby operation mode, the $V_{E/A}$ signal has relatively low value. As a result, the VCO of the synchronous signal generator produces a relatively low frequency oscillating waveform to the pulse generator according to the value of the $V_{E/A}$ signal. Then, the pulse generator outputs a pulse with this relatively low frequency, 1/Tsb, to the PWM comparator as the synchronous signal. In more details, the synchronous signal is coupled to the S terminal of the RS flip-flop. Meanwhile, the $V_{E/A}$ signal is coupled to one input of the comparator AP of the PWM comparator and a ramp signal is coupled to another input of the comparator AP. Hereby, the ramp signal can be a current signal of the main switch of the power converter. Once the synchronous signal triggers the RS flip-flop, the PWM signal begins its high level till the voltage of the ramp signal rises to equal with the voltage of $V_{E/A}$ signal. This time duration, shown as Ton,sb which is the on time of the PWM signal, is relatively very low because of the relatively low voltage of the $V_{E/A}$ signal in the standby operation mode. Therefore, the output PWM signal will have a relatively short on time Ton,sb and a relatively low frequency.

As to the normal operation mode with the operations waveforms shown in FIG. 6b, the voltage of the $V_{E/A}$ signal is relatively high. With the same scheme as aforementioned in the standby operation mode, the generated synchronous signal will have relatively a high frequency corresponding to a low period as Tnor. While the PWM signal will have a relatively long on time shown as Ton,nor. Thus the PWM signal features relatively the high frequency and high duty cycle at normal operation mode.

Figure 7:
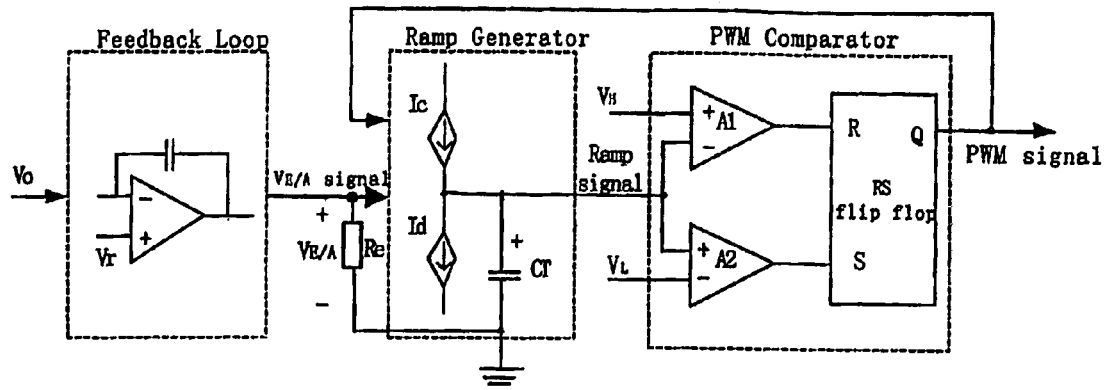
FIG. 7 shows another preferred embodiment of the controller circuit according to the present invention.

In FIG. 7, another controller circuit according to the present invention is shown, in which the off time and the on time of the generated PWM signal are changed with the error-amplified voltage simultaneously. A PWM signal with relatively a very low duty cycle and a low frequency can be generated by this means.

The overall circuit of this invention comprises three parts: a feedback loop, which inputs with an output voltage Vo of a switching mode power converter (not shown) and outputs an error-amplified voltage $V_{E/A}$, a ramp generator, and a PWM comparator.

The ramp generator is formed with a charge current source $I_c$, a discharge current source $I_d$, and a timing capacitor CT.

Two comparators, shown in FIG. 7 as A1 and A2, and a RS flip-flop make up the PWM comparator. $V_H$ and $V_L$, as a high reference voltage and a low reference voltage respectively, are connected to a noninverting terminal of the comparator A1 and an inverting terminal of the comparator A2 respectively.

The output voltage Vo of the switching mode power converter is input into the feedback loop. An error-amplified voltage is generated by the feedback loop as $V_{E/A}$. As the conventional design of the feedback loop, when the output load is high, $V_{E/A}$ will be high relatively. The $V_{E/A}$ voltage controls the charge current source $I_c$ and the discharge current source $I_d$. The voltage of the $V_{E/A}$ controls the values of $I_c$ and $I_d$. The output PWM signal, which is an optional input of the ramp generator, can be selectively omitted without damping the functions of the ramp generator. When $V_{E/A}$ is high, the value of $I_c$ of the ramp generator will be high and the value of its $I_d$ will be low relatively.

Figure 8A:
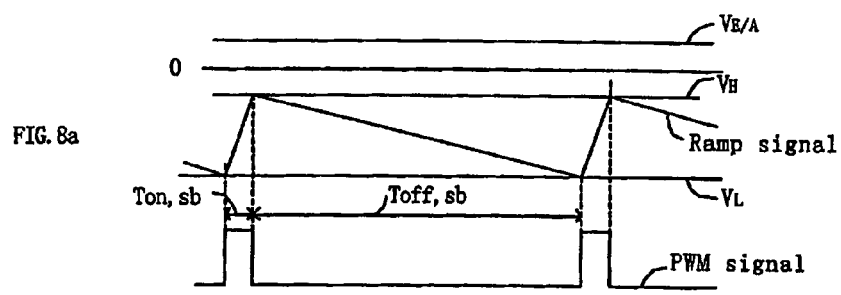
FIG. 8 shows the operation waveforms of the controller circuit according to the second preferred embodiment of the present invention.
Figure 8B:
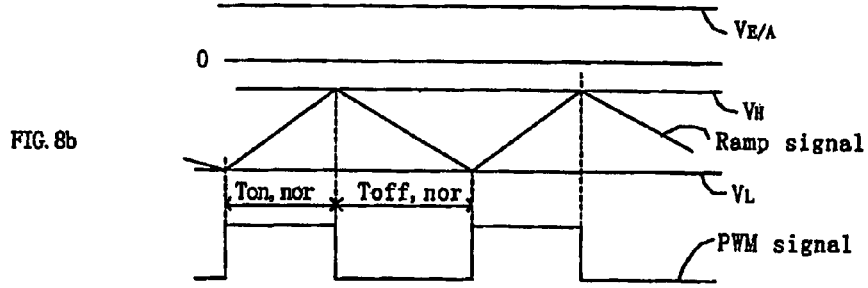

The operation waveforms can be illustrated in FIG. 8a and FIG. 8b, wherein FIG. 8a shows the standby operation mode and FIG. 8b shows the normal operation mode. It can be seen from the aforementioned analysis, the charge current $I_c$ will be high in the standby operation mode due to the relatively low $V_{E/A}$. Thus, the Ton time of the PWM signal, which is the time of the charge current $I_c$ charging the voltage across CT from $V_L$ to $V_H$, will be relatively short. Meanwhile, the discharge current $I_d$ is relatively low and the Toff time of the PWM signal, which is the time of the discharge current $I_d$ discharging the voltage across CT from $V_H$ to $V_L$, will be relatively long. Please refer to FIG. 8b. With the same principle, when the converter operates under a normal load condition, the Ton time of the PWM signal will be relatively long while Toff time is relatively short.

As a result, this PWTM controller features with relatively a high switching frequency and a high duty cycle under the normal load operation, and a low switching frequency and a low duty cycle under the light load operation with this second embodiment of the present invention.

Therefore, with the PWM control of the present invention, the switching mode converter can be designed with relatively high frequency, which benefits to high power density. At light load, the converter will be operated in relatively a low switching frequency and a low duty cycle, therefore, a relatively low standby loss with low output ripple. For low control circuit loss at standby mode operation, the charging and discharging of $I_c$ and $I_d$ can be modulated by output PWM signal. When the PWM signal is in a high voltage level, the $I_c$ is set to the value as aforementioned while the value of $I_d$ is set to zero. When the PWM signal is in a low voltage level, the $I_d$ is set to the value as aforementioned while the value of $I_c$ is set to zero.

Although the present invention has been described in terms of the presently preferred embodiment, it is to be understood that such disclosure is not to be interpreted as limiting. Various alterations and modifications will no doubt become apparent to those skilled in the art after having read the above disclosure.

What is claimed is:

1. A circuit that generates a ramp signal used in a pulse width modulation (PWM) signal generation, comprising:
   a feedback loop for generating an error-amplified voltage; and
   a ramp generator coupled to said feedback loop for receiving said error-amplified voltage and being controlled by said error-amplified voltage to generate said ramp signal,
   wherein said ramp generator comprises:
      a timing capacitor to be charged and discharged for generating said ramp signal;
      a charge current source in which its magnitude is controlled by said error-amplified voltage so as to charge said timing capacitor and generate a rising slope of said ramp signal; and
      a discharge current source in which its magnitude is controlled by said error-amplified voltage so as to discharge said timing capacitor and generate a descending slope of said ramp signal.

2. The circuit according to claim 1, wherein said circuit further comprises a PWM comparator coupled to said ramp generator for receiving said ramp signal to generate said PWM signal.

3. The circuit according to claim 2, wherein said PWM signal is selectively input to said ramp generator with said error-amplified voltage so as to generate said ramp signal.

4. The circuit according to claim 2, wherein said PWM comparator comprises:
   a first comparator coupled its inverting input to said ramp signal and its noninverting input to a high level reference voltage for comparing said ramp signal with said high level reference voltage to produce a first comparison output;
   a second comparator coupled its noninverting input to said ramp signal and its inverting input to a low level reference voltage for comparing said ramp signal with said low level reference voltage to produce a second comparison output; and
   a flip-flop circuit coupled to an output of said first and second comparators for generating said PWM signal.

5. The circuit according to claim 2, wherein said PWM comparator is a hysteretic comparator.

6. A ramp signal generation method used in a pulse width modulation (PWM) signal generation employing a circuit comprising a feedback loop and a ramp generator with a charge current source, a timing capacitor and a discharge current source, comprising steps of:
   generating an error-amplified voltage from said feedback loop;
   controlling said charge current source to charge said timing capacitor and generate a rising slope of said ramp signal in which said charge current source's magnitude is controlled by said error-amplified voltage and said charge current source's power on state is controlled by a high level of a PWM signal; and
   controlling said discharge current source to discharge said timing capacitor and generate a descending slope of said ramp signal in which said discharge current source's magnitude is controlled by said error-amplified voltage and said discharge current source's power on state is controlled by a low level of said PWM signal.

7. The method according to claim 6, wherein said ramp generator is coupled to said feedback loop for receiving said error-amplified voltage and being controlled by said error-amplified voltage to generate said ramp signal.

8. The method according to claim 6 wherein said circuit further comprises a PWM comparator coupled to said ramp generator for receiving said ramp signal to generate said PWM signal.

9. The method according to claim 8, wherein said PWM signal is selectively input to said ramp generator with said error-amplified voltage so as to generate said ramp signal.

10. The method according to claim 8, wherein said PWM comparator comprises:
   a first comparator coupled its inverting input to said ramp signal and its noninverting input to a high level reference voltage for comparing said ramp signal with said high level reference voltage to produce a first comparison output;
   a second comparator coupled its noninverting input to said ramp signal and its inverting input to a low level reference voltage for comparing said ramp signal with said low level reference voltage to produce a second comparison output; and
   a flip-flop circuit coupled to an output of said first and second comparators for generating said PWM signal.

11. The method according to claim 8, wherein said PWM comparator is a hysteretic comparator.

* * * * *